(12) United States Patent
Mun et al.

(10) Patent No.: US 9,753,849 B2
(45) Date of Patent: Sep. 5, 2017

(54) METHODS FOR MANUFACTURING AND OPERATING A MEMORY DEVICE AND A METHOD FOR OPERATING A SYSTEM HAVING THE SAME

(71) Applicant: SAMSUNG ELECTRONICS CO., LTD., Gyeonggi-do (KR)

(72) Inventors: Kui Yon Mun, Gyeonggi-do (KR); Young Jin Cho, Seoul (KR); Young Kwang Yoo, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 64 days.

(21) Appl. No.: 14/792,727

(22) Filed: Jul. 7, 2015

(65) Prior Publication Data
US 2016/0005454 A1   Jan. 7, 2016

(30) Foreign Application Priority Data
Jul. 7, 2014   (KR) .................. 10-2014-0084678

(51) Int. Cl.
| | | |
|---|---|---|
| G06F 12/00 | (2006.01) | |
| G06F 13/00 | (2006.01) | |
| G06F 13/28 | (2006.01) | |
| G06F 12/02 | (2006.01) | |
| G11C 29/56 | (2006.01) | |
| G06F 9/44 | (2006.01) | |
| G06F 12/14 | (2006.01) | |
| G06F 9/445 | (2006.01) | |

(52) U.S. Cl.
CPC ........ *G06F 12/0246* (2013.01); *G06F 9/4401* (2013.01); *G11C 29/56008* (2013.01); *G06F 9/445* (2013.01); *G06F 12/14* (2013.01); *G06F 12/1425* (2013.01)

(58) Field of Classification Search
CPC ........ G06F 9/4401; G06F 9/445; G06F 12/14; G06F 12/1425; G06F 12/0246
USPC ................................. 711/103, 105
See application file for complete search history.

(56) References Cited

U.S. PATENT DOCUMENTS

| | | |
|---|---|---|
| 6,256,757 B1 | 7/2001 | Arkin |
| 6,829,722 B2 | 12/2004 | Lin |
| 6,842,867 B2 | 1/2005 | Cooper |
| 7,642,105 B2 | 1/2010 | Co et al. |
| 7,827,445 B2 | 11/2010 | Foster, Sr. et al. |
| 8,208,325 B2 | 6/2012 | Urakawa et al. |
| 2001/0006481 A1* | 7/2001 | Daehn .................. G11C 29/80 365/201 |
| 2001/0009551 A1* | 7/2001 | Moriwaki ............. H04L 49/108 370/395.31 |

(Continued)

FOREIGN PATENT DOCUMENTS

| | | |
|---|---|---|
| JP | 2008-107897 | 5/2008 |
| JP | 2013-062008 | 4/2013 |

*Primary Examiner* — Charles Rones
*Assistant Examiner* — Sidney Li
(74) *Attorney, Agent, or Firm* — F. Chau & Associates, LLC

(57) ABSTRACT

A method for manufacturing a memory device includes detecting, with a tester, whether memory cells included in a memory device are defective, and programming, with the tester, start addresses of defect-free memory regions for addressing modes of the memory device based on a result of the detection.

16 Claims, 11 Drawing Sheets

TABLE1

| Addressing Mode(AM) | Number of Banks | Address | |
|---|---|---|---|
| | | SIZE1 | SIZE2 |
| RBC | 4 | ADD1 | ADD2 |
| BRC | 4 | ADD3 | ADD4 |

(56) References Cited

U.S. PATENT DOCUMENTS

| | | | |
|---|---|---|---|
| 2003/0002363 A1* | 1/2003 | Le | G11C 29/883 365/200 |
| 2003/0204783 A1 | 10/2003 | Kuroda | |
| 2004/0078700 A1* | 4/2004 | Jeong | G11C 29/765 714/42 |
| 2004/0088614 A1 | 5/2004 | Wu | |
| 2005/0162963 A1* | 7/2005 | Parekh | G11C 29/789 365/225.7 |
| 2008/0201661 A1* | 8/2008 | Haynes | G06F 3/0607 715/810 |

* cited by examiner

FIG. 2

TABLE1

| Addressing Mode(AM) | Number of Banks | Address | |
|---|---|---|---|
| | | SIZE1 | SIZE2 |
| RBC | 4 | ADD1 | ADD2 |
| BRC | 4 | ADD3 | ADD4 |

FIG. 5

TABLE2

| Addressing Mode(AM) | Number of Banks | Address | |
|---|---|---|---|
| | | SIZE3 | SIZE4 |
| RBC | 8 | ADD5 | ADD6 |
| BRC | 8 | ADD7 | ADD8 |

METHODS FOR MANUFACTURING AND OPERATING A MEMORY DEVICE AND A METHOD FOR OPERATING A SYSTEM HAVING THE SAME

CROSS-REFERENCE TO RELATED APPLICATION

This application claims priority under 35 U.S.C. §119 to Korean Patent Application No. 10-2014-0084678 filed on Jul. 7, 2014, the disclosure of which is incorporated by reference herein in its entirety.

TECHNICAL FIELD

Exemplary embodiments of the present inventive concept relate to a memory device, and more particularly, to a method for operating a memory device which can transfer information about a defect-free memory region to a host by addressing mode and a method for operating a system having the same.

DISCUSSION OF RELATED ART

An addressing mode is a mode which maps an address used by a central processing unit (CPU) in a memory controller onto a physical address of a memory device. The addressing mode varies depending on a host or a system configuration including the host.

To detect a defective region of a dynamic random access memory (DRAM), at system power-on, a host tests all memory cells included in the DRAM and creates a defective-cell list according to a result of the test. However, since the test occurs at system power-on, a booting time of the system or a current consumed by the test is increased.

SUMMARY

An exemplary embodiment of the present inventive concept provides a method for manufacturing a memory device which can store information on defect-free memory regions by addressing mode in a mass-production phase.

An exemplary embodiment of the present inventive concept provides a method for operating a memory device which can transfer information about at least one of the defect-free memory regions to a host in response to an instruction output from the host. An exemplary embodiment of the present inventive concept provides a method for operating a memory system which can use the memory device and the information about the at least one defect-free memory region.

An exemplary embodiment of the present inventive concept is directed to a method for manufacturing a memory device, including detecting, with a tester, whether memory cells included in a memory device are defective, and programming, with the tester, start addresses of the defect-free memory regions for addressing modes in the memory device based on a result of the detection.

When the memory device is a dynamic random-access memory (DRAM) including banks, each of the banks includes memory cells, and each of the defect-free memory regions is included in at least one of the banks. The start addresses may be stored in a mode register. The start addresses may be stored using fuses.

When the memory device includes a first memory and a second memory, the first memory includes the defect-free memory regions and the second memory stores the start addresses.

The first memory may be a dual data rate (DDR) memory, and the second memory may be a flash memory, a DRAM including the flash memory, a phase-change random-access memory (PRAM), a magnetoresistive random-access memory (MRAM), a resistive random-access memory (RRAM), an embedded multi-media card (eMMC), a solid state drive (SSD), a universal serial bus (USB) flash drive, or a universal flash storage (UFS).

An exemplary embodiment of the present inventive concept is directed to a method for operating a memory device, including receiving an instruction from a host, and transferring at least one of start addresses of defect-free memory regions for addressing modes to the host in response to the instruction. The start addresses are different from each other, and the start addresses respectively depend on a size of a corresponding one of the defect-free memory regions.

The memory device is a DDR memory, and the start addresses are stored in a mode register.

The memory device includes: a DRAM which includes the defect-free memory regions; a non-volatile memory which stores the start addresses; and a DRAM interface which reads at least one of the start addresses stored in the non-volatile memory in response to the instruction, and transfers the at least one read start address to the host.

An exemplary embodiment of the present inventive concept is directed to a method for operating a memory system which includes a host, a first memory device, and a second memory device, including reading, by the host, a first start address of a plurality of start addresses from the first memory device, the plurality of start addresses correspond to defect-free memory regions for addressing modes, reading, by the host, a boot loader from the second memory device, and writing, by the host, the boot loader in a defect-free memory region corresponding to the first start address.

The first memory device is a DDR memory, and the start addresses are stored in a mode register.

The first memory device includes a DRAM which includes the defect-free memory region, a non-volatile memory which stores the start addresses, and a DRAM interface which reads the first start address stored in the non-volatile memory in response to an instruction output from the host, and transfers the first start address to the host.

The start addresses are different from each other, and the start addresses respectively depend on a size of a corresponding one of the defect-free memory regions.

The addressing modes include a row-bank-column addressing mode and a bank-row-column addressing mode.

The host includes a central processing unit (CPU), a first memory controller which reads the first start address according to a control of the CPU, and a second memory controller which reads the boot loader according to a control of the CPU, and the first memory controller writes the boot loader in the defect-free memory region corresponding to the first start address.

The host includes a CPU, a first memory controller which reads the first start address when the system is booted, and a second memory controller which reads the boot loader according to a control of the CPU, and the first memory controller writes the boot loader in the defect-free memory region corresponding to the first start address.

An exemplary embodiment of the present inventive concept is directed to a method of operating a memory test system including a tester and a memory device, the method comprising: providing, from the memory device to the tester, start location information of a defect-free memory region of the memory device; and writing, from the tester to the memory device, code for booting the memory system in the defect-free memory region using the start location information.

The start location information corresponds to an addressing mode of the tester.

The tester does not test all memory cells of the memory device at power-on of the memory system.

BRIEF DESCRIPTION OF THE DRAWINGS

The above and other features of the present inventive concept will become more apparent by describing in detail exemplary embodiments thereof with reference to the accompanying drawings in which:

FIG. 2 is a table which includes start addresses of defect-free memory regions by addressing mode according to an exemplary embodiment of the present inventive concept;

FIG. 5 is a table which includes start addresses of defect-free memory regions by addressing mode according to an exemplary embodiment of the present inventive concept;

DETAILED DESCRIPTION OF THE EMBODIMENTS

Figure 1:
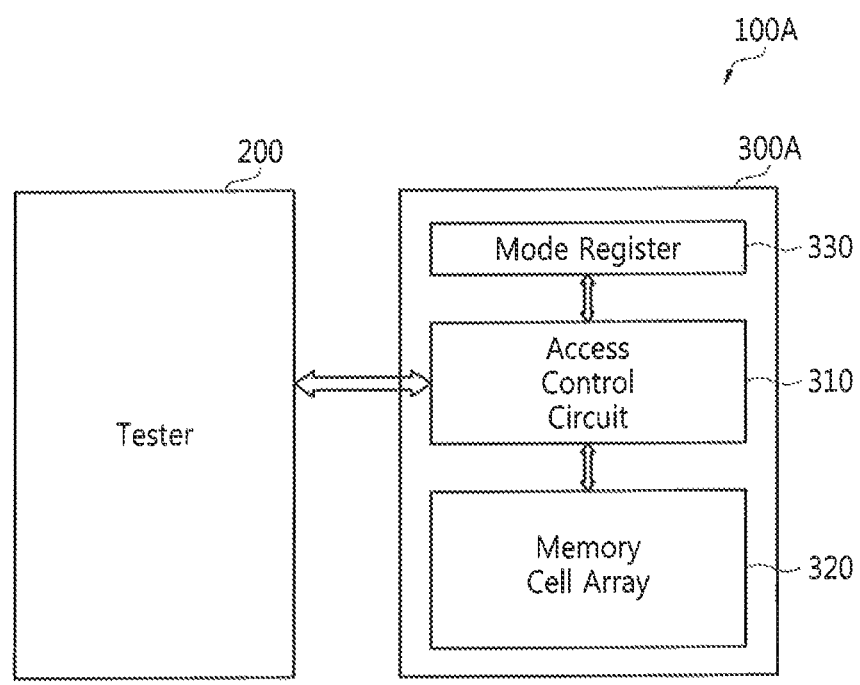
FIG. 1 is a block diagram of a memory test system which can program a start address of a defect-free memory region according to an exemplary embodiment of the present inventive concept.

The present inventive concept now will be described more fully hereinafter with reference to the accompanying drawings, in which exemplary embodiments thereof are shown. This inventive concept may, however, be embodied in many different forms and should not be construed as limited to the embodiments set forth herein. In the drawings, the size and relative sizes of layers and regions may be exaggerated for clarity. Like numbers may refer to like elements throughout the application.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a block diagram of a memory test system which can program a start address of a defect-free memory region according to an exemplary embodiment of the present inventive concept. Referring to FIG. 1, a memory test system 100A includes a tester 200 and a memory device 300A.

The tester 200 may denote a device or a circuit which can test whether or not each of a plurality of memory cells included in a memory cell array 320 of the memory device 300A is defective in a mass-production phase. The tester 200 may transfer an instruction and/or data necessary for testing the memory device 300A to the memory device 300A, analyze test data output from the memory device 300A, and determine a function and performance of the memory device 300A according to a result of the analysis.

The tester 200 may determine whether or not each of a plurality of memory cells included in the memory cell array 320 of the memory device 300A is defective according to a result of the analysis, and program start position information (e.g., a start address) of a memory region (hereinafter, referred to as a "defect-free memory region") which successively includes a plurality of defect-free memory cells in a mode register 330 of the memory device 300A according to a result of the determination.

At least one defect-free memory region in an exemplary embodiment of the present inventive concept may have a fixed size. The tester 200 may determine a size of at least one defect-free memory region.

The memory device 300A may include an access control circuit 310, the memory cell array 320, and the mode register 330. The memory device 300A may be embodied in a dynamic random access memory (DRAM) or a synchronous DRAM (SDRAM) according to an exemplary embodiment of the present inventive concept. A dual data rate (DDR) memory may be embodied in the DRAM or the SDRAM.

The access control circuit 310 may control an access operation of the memory cell array 320 based on an instruction and/or an address(es) output from the tester 200. The access operation includes a write operation or a read operation. The access control circuit 310 may decode an instruction and/or an address(es) output from the tester 200, and select at least one memory cell to be accessed according to a result of the decoding.

The memory cell array 320 includes a plurality of word lines, a plurality of bit lines, and a plurality of memory cells. Here, an address may select a corresponding word line among the plurality of word lines or a corresponding bit line among the plurality of bit lines.

During a write operation, the access control circuit 310 may write data output from the tester 200 in a memory region of the memory cell array 320 using an instruction and/or an address(es) output from the tester 200. The memory region may include a plurality of memory cells. During a read operation, the access control circuit 310 may read data written in a memory region of the memory cell array 320 using an instruction and/or an address(es) output from the tester 200 and transfer the read data to the tester 200.

For example, the tester 200 may compare the data written in a memory region with the data read from the memory region, and determine whether or not each of a plurality of memory cells included in the memory region is defective based on a result of the comparison. The tester 200 may store data the same as the data written in a memory region.

The tester 200 may generate a first table TABLE1 shown in FIG. 2 based on whether or not each of the plurality of memory cells is defective. The mode register 330 may store the first table TABLE1 to be described referring to FIG. 2. The access control circuit 310 may write the first table TABLE1 output from the tester 200 in the mode register 330.

When the memory cell array 320 is embodied in a DRAM or a SDRAM, the mode register 330 may perform a function of a non-volatile memory.

The mode register 330 is shown as a memory which can store the first table TABLE1 in FIG. 1; however, the mode register 330 may be replaced with a non-volatile memory. In this case, the non-volatile memory may be embodied in a programmable read-only memory (PROM), a field programmable read-only memory (FPROM), a one-time programmable (OTP) non-volatile memory, a fuse, or an anti-fuse.

FIG. 2 is a table which includes start addresses of defect-free memory regions by addressing mode according to an exemplary embodiment of the present inventive concept. Referring to FIGS. 1 and 2, the first table TABLE1 to be programmed in the mode register 330 of the memory device 300A or the above-mentioned non-volatile memory by the tester 200 may include start location information (or a start address) of each defect-free memory region determined according to an addressing mode AM and a size of a defect-free memory region.

Each of the plurality of addressing modes AM may be determined according to a combination of a bank value, a row value, and a column value. For example, the plurality of addressing modes AM may include a row-bank-column addressing mode (RBC) and a bank-row-column addressing mode (BRC).

Referring to FIG. 2, the first table TABLE1 may include start addresses ADD1 to ADD4 each corresponding to different start location information according to each addressing mode (e.g., RBC and BRC), the number of banks (e.g., four), and a size of each defect-free memory region (SIZE1 and SIZE2). The present inventive concept is not limited to the number of addressing modes, the number of banks, and the number and size of defect-free memory regions, which are shown in the first table TABLE1 of FIG. 2.

In a mass-production phase of the memory device 300A, it is not known which one of a plurality of addressing modes will be used by a host to be connected to the memory device 300A. For example, according to whether an addressing mode used by a host is the RBC addressing mode or the BRC addressing mode, respective start addresses of each of defect-free memory regions to be used by the host are different from each other.

Figure 3:
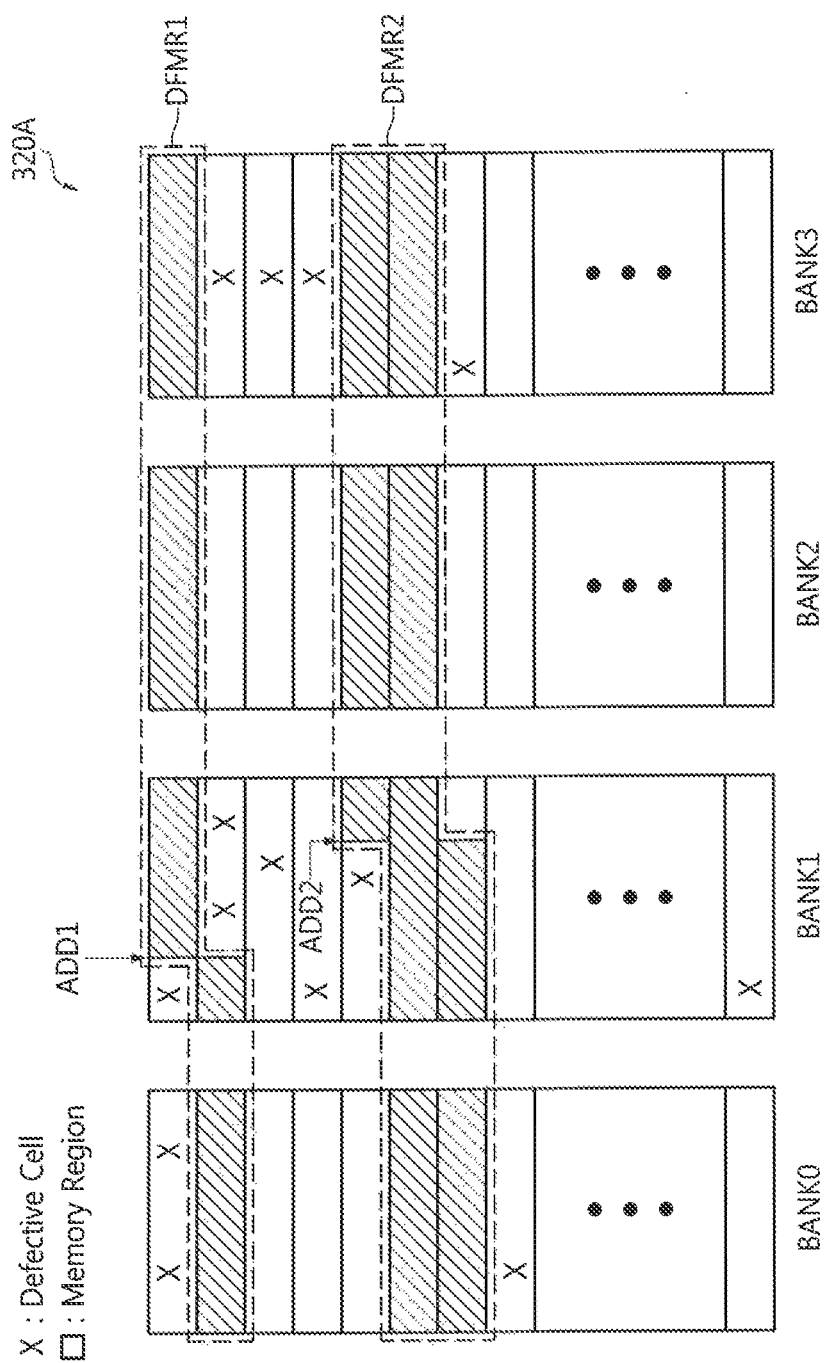
FIG. 3 is a diagram of defect-free memory regions corresponding to the table shown in FIG. 2, according to an exemplary embodiment of the present inventive concept.
Figure 4:
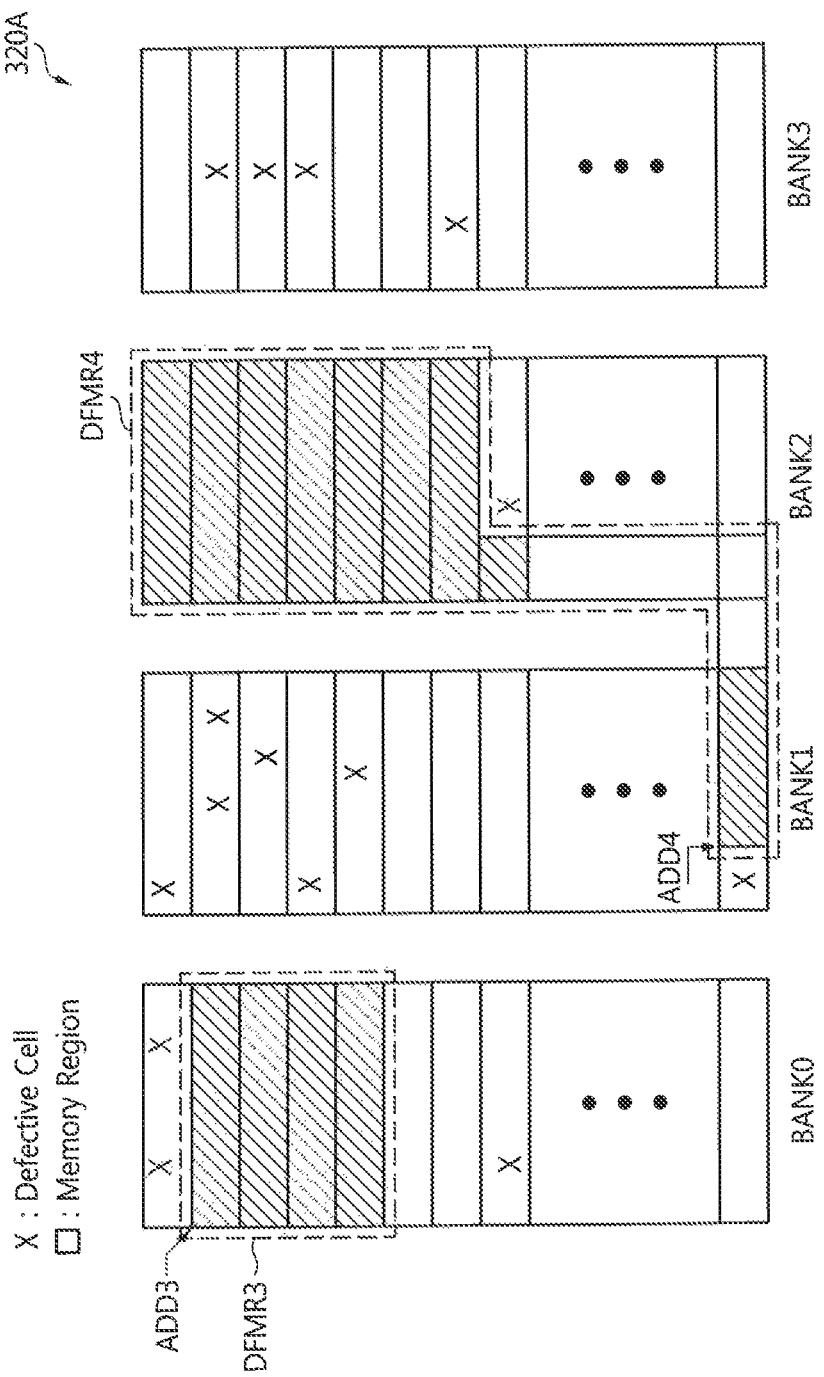
FIG. 4 is a diagram of the defect-free memory regions corresponding to the table shown in FIG. 2, according to an exemplary embodiment of the present inventive concept.

FIG. 3 is a diagram of defect-free memory regions corresponding to the table shown in FIG. 2, according to an exemplary embodiment of the present inventive concept. The memory cell array 320 of FIG. 1 may be embodied in the memory cell array 320A which includes four banks BANK0 to BANK3 as shown in FIGS. 3 and 4.

Referring to FIGS. 2 and 3, when the addressing mode AM is the RBC, the number of banks embodied in the memory cell array 320A is four, a size of a first defect-free memory region DFMR1 is a first size (SIZE1), and a start address of the first defect-free memory region DFMR1 is ADD1. In addition, when the addressing mode AM is the RBC, the number of banks embodied in the memory cell array 320A is four, a size of a second defect-free memory region DFMR2 is a second size (SIZE2), and a start address of the second defect-free memory region DFMR2 is ADD2. For example, the second size SIZE2 may be larger than the first size SIZE1.

Each start address ADD1 or ADD2 may be determined by a row value, a bank value, and a column value. For example, each start address ADD1 or ADD2 is different from a system address used by the tester 200 or a host as a device address.

Accordingly, a mapping scheme is used between the system address (or system addressing protocol) and the device address (or device addressing protocol) so that the tester 200 or the host writes data (e.g., at least one start address) in the memory cell array 320A or reads data (for example, at least one start address) from the memory cell array 320A. The mapping scheme may be performed by the tester 200 or the host.

When the mapping scheme used by tester 200 or the host is the RBC, upper bits of a system address are mapped onto a row R or a row address, lower bits of the system address are mapped onto a column C or a column address, and the remaining bits of the system address are mapped onto a bank B or a bank address. Here, the upper bits include a most significant bit (MSB), and the lower bits include a least significant bit (LSB).

When the mapping scheme used by the tester 200 or the host is the BRC, upper bits of a system address are mapped onto a bank B or a bank address, lower bits of the system address are mapped onto a column C or a column address, and the remaining bits of the system address are mapped onto a row R or a row address.

FIG. 4 is a diagram of defect-free memory regions corresponding to the table shown in FIG. 2, according to an exemplary embodiment of the present inventive concept. Referring to FIGS. 2, 3, and 4, when the addressing mode AM is the BRC, the number of banks embodied in the memory cell array 320A is four, a size of a third defect-free memory region DFMR3 is a first size SIZE1, and a start address of the third defect-free memory region DMFR3 is ADD3.

Moreover, when the addressing mode AM is the BRC, the number of banks embodied in the memory cell array 320A is four, a size of a fourth defect-free memory region DFMR4 is a second size SIZE2, and a start address of the fourth defect-free memory region DFMR4 is ADD4. Each start address ADD3 or ADD4 may be determined by a row value, a bank value, and a column value.

As shown in FIGS. 3 and 4, according to whether the addressing mode is a row-bank-column RBC addressing mode or a bank-row-column BRC addressing mode, respective start addresses ADD1 to ADD4 are different from each other.

FIG. 5 is a table which includes start addresses of defect-free memory regions by addressing mode according to an exemplary embodiment of the present inventive concept. The memory cell array 320 of FIG. 1 may be embodied in a memory cell array 320B which includes eight banks BANK0 to BANK7 as shown in FIG. 6.

Referring to FIGS. 1 and 5, a second table TABLE2 which is programmed in the mode register 330 of the memory device 300B or the above-mentioned non-volatile memory by the tester 200 may include start location information of each defect-free memory region for each of the plurality of addressing modes AM.

Figure 6:
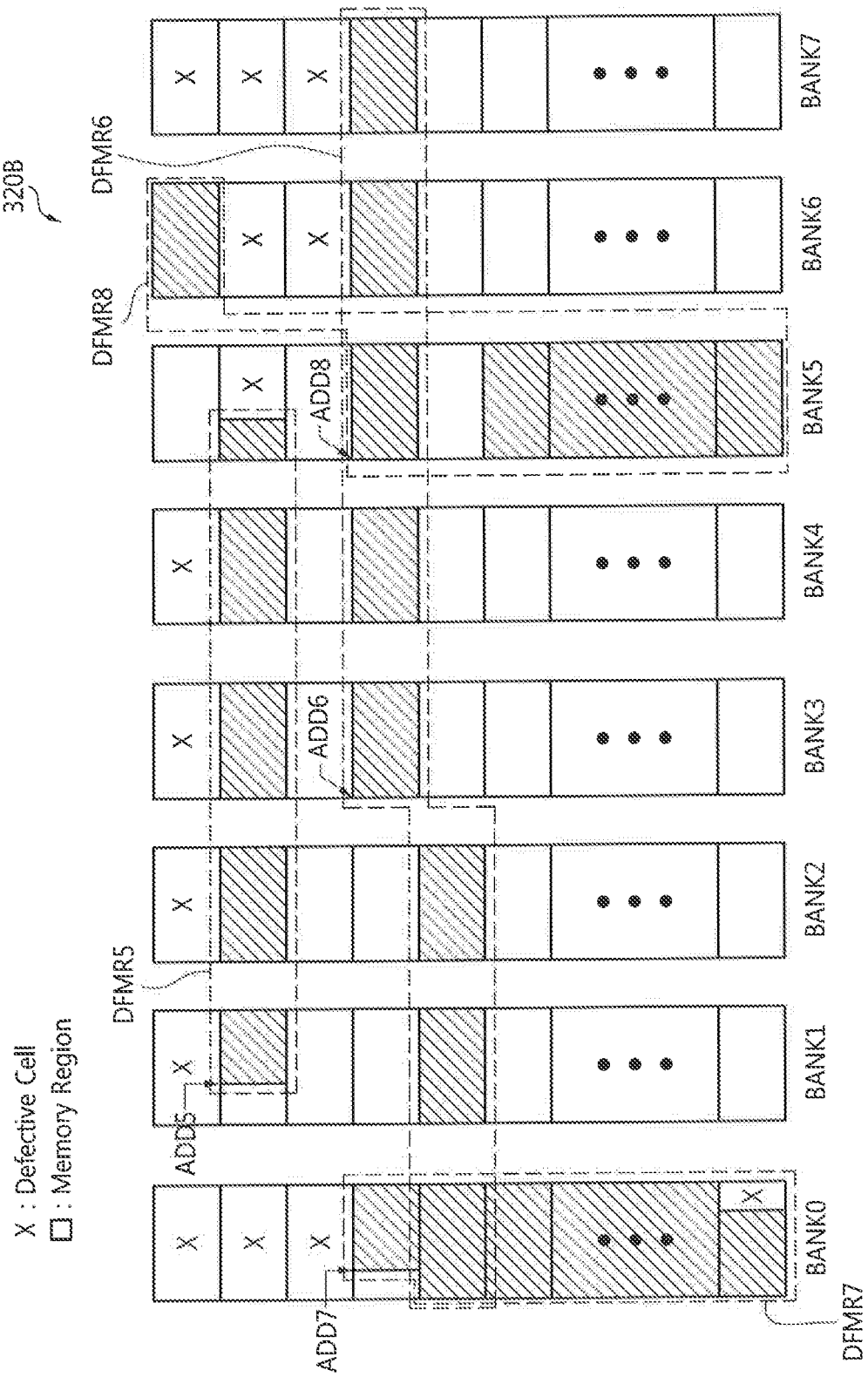
FIG. 6 is a diagram of defect-free memory regions corresponding to the table shown in FIG. 5, according to an exemplary embodiment of the present inventive concept.

FIG. 6 is a diagram of defect-free memory regions corresponding to the table shown in FIG. 5, according to an exemplary embodiment of the present inventive concept. Referring to FIGS. 5 and 6, when the addressing mode AM is the RBC, the number of banks embodied in the memory cell array 320B is eight, a size of a fifth defect-free memory region DFMR5 is a third size SIZE3, and a start address of the fifth defect-free memory region DFMR5 is ADD5.

In addition, when the addressing mode AM is the RBC, the number of banks embodied in the memory cell array 320B is eight, a size of a sixth defect-free memory region DFMR6 is a fourth size SIZE4, and a start address of the sixth defect-free memory region DFMR6 is ADD6.

When the addressing mode AM is the BRC, the number of banks embodied in the memory cell array 320B is eight, a size of a seventh defect-free memory region DFMR7 is a third size SIZE3, and a start address of the seventh defect-free memory region DFMR7 is ADD7. Moreover, when the addressing mode AM is the BRC, the number of banks embodied in the memory cell array 320B is eight, a size of an eighth defect-free memory region DFMR8 is a fourth size SIZE4, and a start address of the eighth defect-free memory region DFMR8 is ADD8. For example, the fourth size SIZE4 may be larger than the third size SIZE3.

Figure 7:
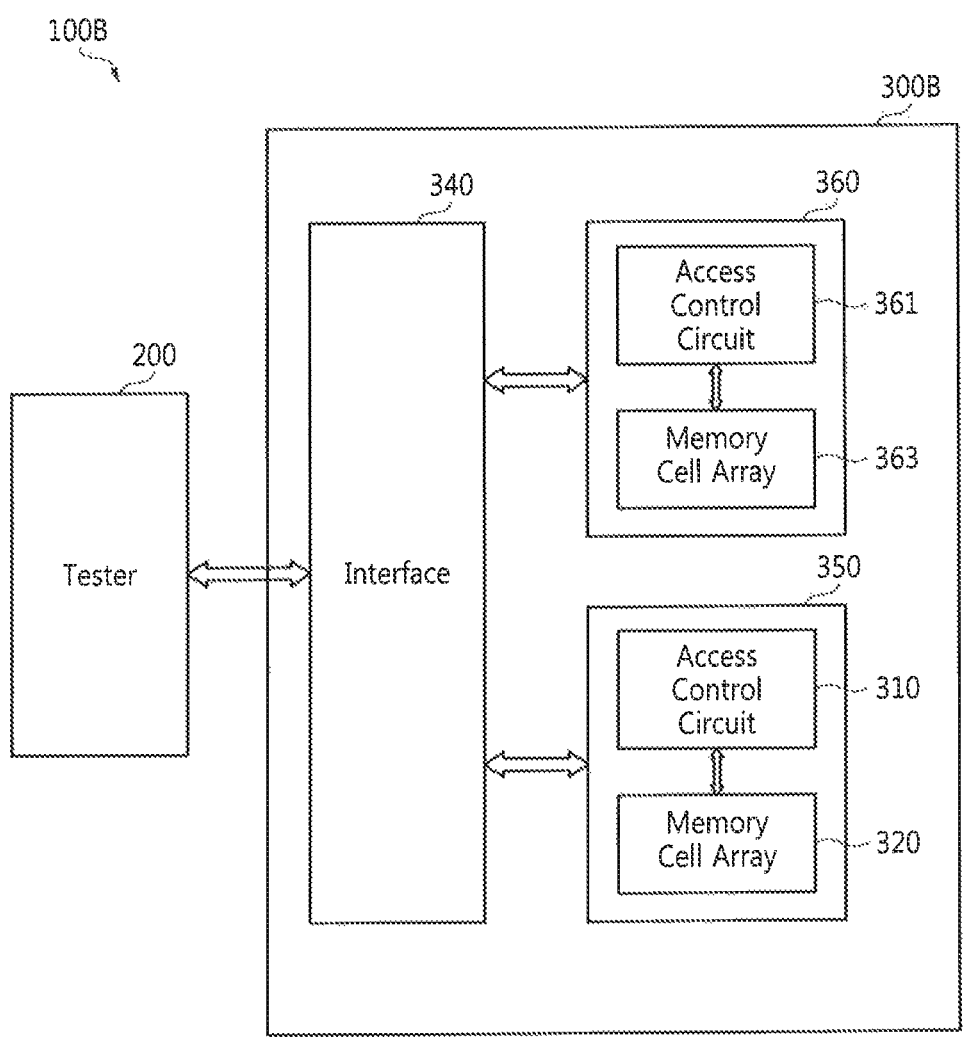
FIG. 7 is a block diagram of a memory test system which can program a start address of a defect-free memory region according to an exemplary embodiment of the present inventive concept.

FIG. 7 is a block diagram of a memory test system which can program a start address of a defect-free memory region according to an exemplary embodiment of the present inventive concept. Referring to FIG. 7, a memory test system 100B includes the tester 200 and a memory device 300B. The memory device 300B includes an interface 340, a first chip 350, and a second chip 360. For example, the memory device 300B may be embodied in a multi chip package (MCP).

When the first chip 350 is embodied in a dual data rate (DDR) memory, the second chip may be embodied in one of a flash memory, a DRAM including the flash memory, a Phase-change random-access memory (PRAM), a Magnetoresistive random-access memory (MRAM), a Resistive random-access memory (RRAM), or an electrically erasable programmable read-only memory (EEPROM). The flash memory may include a NAND flash memory or a NOR flash memory. According to an exemplary embodiment of the present inventive concept, the second chip 360 may be embodied in a memory solution including a non-volatile memory, such as an embedded multimedia card (e-MMC), a solid state drive (SSD), a universal flash memory (UFS), or a universal serial bus (USB) flash drive.

The interface 340 may control an access operation of the first chip 350 and the second chip 360. The first chip 350 or the second chip 360 may transfer or receive an instruction and/or data to or from the tester 200 or a host through the interface 340.

The first chip 350 includes the access control circuit 310 and the memory cell array 320. The memory cell array 320 includes defect-free memory regions. A structure and an operation of the first chip 350 of FIG. 7 may be substantially the same as a structure and an operation of the memory device 300A of FIG. 1.

As described above, the tester 200 determines whether or not each of a plurality of memory cells included in the memory cell array 320 of the first chip 350 is defective, and programs a table including start location information of at least one defect-free memory region in a memory cell array 363 of the second chip 360 through the interface 340 according to a result of the determination.

The second chip 360 includes an access control circuit 361 in addition to the memory cell array 363.

The access control circuit 361 may write the first table TABLE1 or the second table TABLE2 output from the tester 200 to the memory cell array 363. The memory cell array 363 may include flash-based memory cells. When the first chip 350 is embodied in a DRAM chip, the interface 340 is embodied in a DRAM interface and the interface 340 may control an access operation of the second chip 360 using the DRAM interface.

Figure 8:
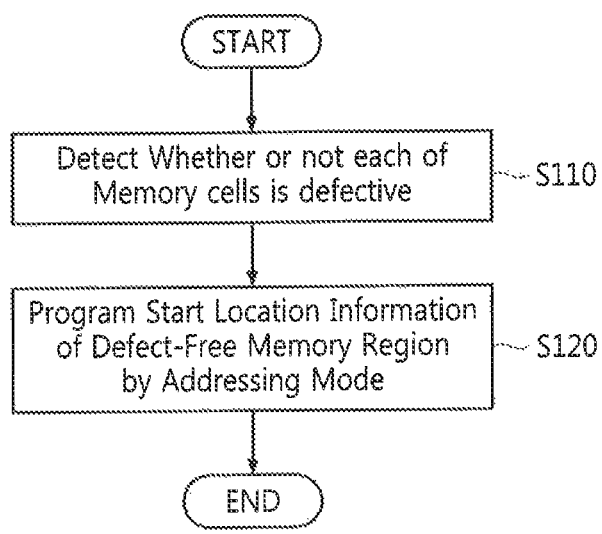
FIG. 8 is a flowchart for describing a method for operating the memory test system shown in FIG. 1 or 7, according to an exemplary embodiment of the present inventive concept.

FIG. 8 is a flowchart for describing a method for operating the memory test system shown in FIG. 1 or 7, according to an exemplary embodiment of the present inventive concept. Referring to FIGS. 1 to 8, the tester 200 connected to the memory device 300A or 300B detects whether or not each of a plurality of memory cells included in the memory cell array 320 is defective (S110).

The tester 200 programs a table, e.g., TABLE1 or TABLE2, which includes start addresses of defect-free memory regions for addressing modes in the memory device 300A or 300B based on a result of the detection (S120). Each of the addressing modes may be determined based on a combination of a bank value, a row value, and a column value.

For example, when the memory device 300A or 300B is embodied in a DRAM, a table, e.g., TABLE1 or TABLE2, which includes start addresses of defect-free memory regions may be stored in a non-volatile memory, e.g., an EEPROM, embodied inside the DRAM.

When the memory device 300A is a DRAM which includes a plurality of banks BANK0 to BANK3 or BANK0 to BANK7 (see e.g., FIG. 6), and each of the plurality of banks BANK0 to BANK3 or BANK0 to BANK7 includes corresponding memory cells among a plurality of memory cells, each of defect-free memory regions DFMR1 to DFMR8 (see e.g., FIG. 6) is included in at least one bank among the plurality of banks BANK0 to BANK3 or BANK0 to BANK7.

According to an exemplary embodiment of the present inventive concept, the memory device 300A stores a table, e.g., TABLE1 or TABLE2, which includes start addresses in the mode register 330. According to an exemplary embodiment of the present inventive concept, the memory device 300B stores a table, e.g., TABLE1 or TABLE2, which includes start addresses in the memory cell array 363 of the second chip 360.

Figure 9:
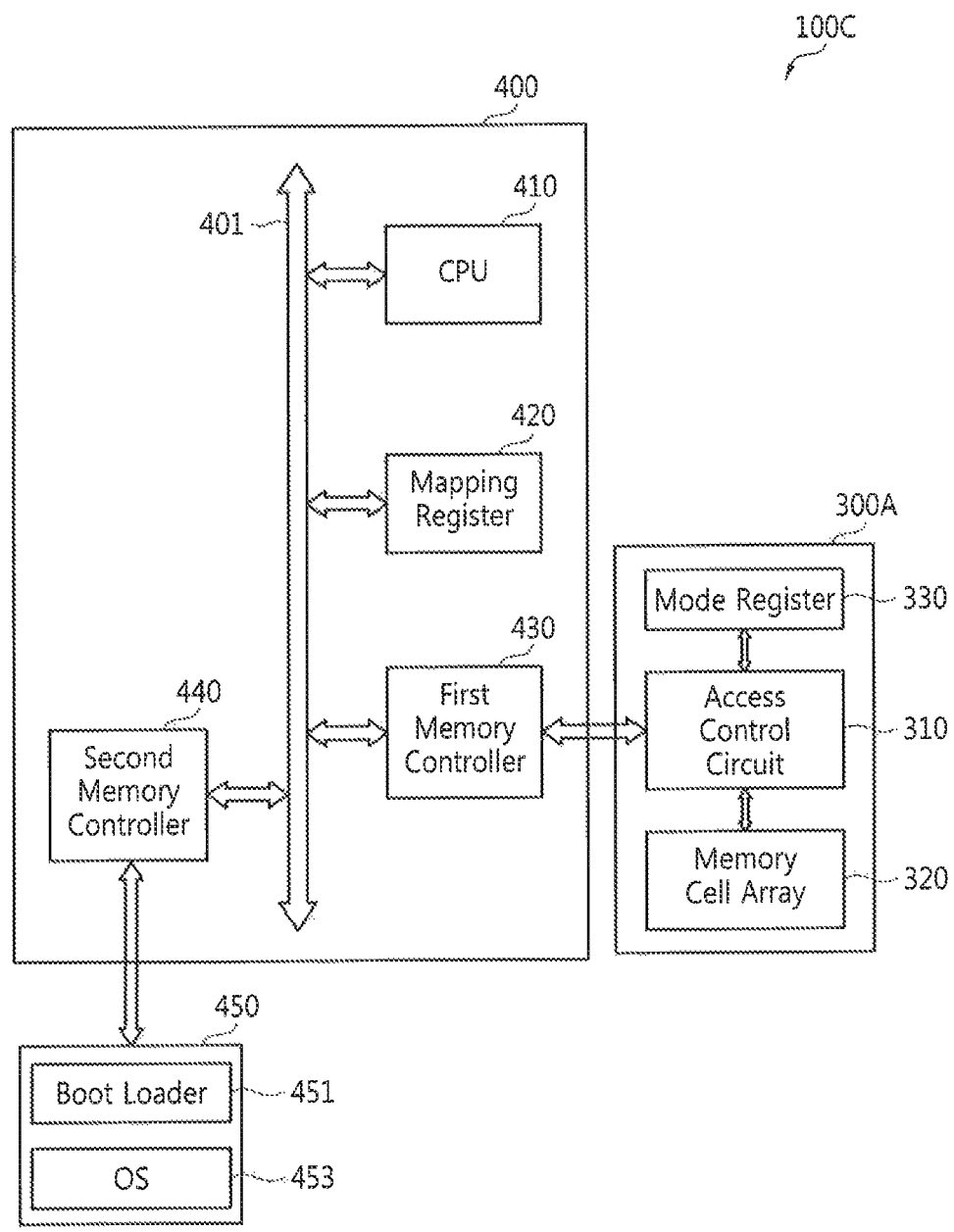
FIG. 9 is a memory system which includes a memory device including a start address of a defect-free memory region by addressing mode, according to an exemplary embodiment of the present inventive concept.

FIG. 9 is a memory system which includes a memory device including a start address of a defect-free memory region by addressing mode, according to an exemplary embodiment of the present inventive concept. As described above, the memory device 300A may store a start address (or a table including the start address) of at least one defect-free memory region by addressing mode and a size of the defect-free memory region. A start address(es) or a table of a defect-free memory region stored in each memory device 300A may be transferred to host 400 by a request or an instruction of the host 400.

Referring to FIG. 9, a memory system 100C includes the host 400, the first memory device 300A, and a second memory device 450. The memory system 100C may be embodied in a personal computer (PC) or a portable electronic device. The portable electronic device may be embodied in a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, or an e-book.

The host 400 may control an operation of the first memory device 300A and the second memory device 450. The host 400 may be embodied in an integrated circuit, a system on chip (SoC), an application processor (AP), or a mobile AP.

The host 400 includes a CPU 410, a mapping register 420, a first memory controller 430, and a second memory controller 440.

The CPU 410 may control the mapping register 420, the first memory controller 430, and the second memory controller 440 through a bus 401. The CPU 410 may be a microprocessor, a micro controller, or a digital signal processor. The CPU 410 may perform instructions of a computer program, an operating system (OS), one or more programs, and/or one or more applications. The CPU 410 may use at least one of a plurality of addressing modes.

The mapping register 420 may store a start address(es) or a table output from the memory device 300A. The mapping register 420 separated from the first memory controller 430 is shown in FIG. 9; however, the mapping register 420 may be a part of the first memory controller 430 according to an exemplary embodiment of the present inventive concept.

The first memory controller 430 may control or manage an instruction and/or data to be transferred to the first memory device 300A. In addition, the first memory controller 430 may control or manage a start address(es) or a table transferred from the first memory device 300A. The first memory controller 430 may support a plurality of addressing modes.

According to an exemplary embodiment of the present inventive concept, the first memory controller 430 may read a start address (or a table including the start address) of a defect-free memory region corresponding to an addressing mode and a size of the defect-free memory region from the first memory device 300A according to a control of the CPU 410 or when booting the memory system 100C. In other words, with further reference to FIGS. 2 and 3, when the CPU 410 uses the RBC addressing mode, and the CPU 410 programs a specific program in a defect-free memory region DFMR1 having a first size SIZE1, the first memory controller 430 may read the first start address ADD1 from the first table TABLE1 stored in the mode register 330 of the first memory device 300A according to a control of the CPU 410. For example, the defect-free memory region DFMR1 may perform a function of a safe boot region.

The first memory controller 430 may store the first start address ADD1 in the mapping register 420. In this case, the first memory controller 430 may map a system address output from the CPU 410 onto the first start address ADD1.

The second memory controller 440 may read a boot loader 451 from the second memory device 450 according to a control of the CPU 410, and write the boot loader 451 in the defect-free memory region DFMR1 defined by the first start address ADD1 using the first memory controller 430. The boot loader 451 is a program related to a booting. In other words, the first memory controller 430 transfers the boot loader 451 read by the second memory controller 440 and a write instruction including the first start address ADD1 to store the boot loader 451 to the access control circuit 310 of the first memory device 300A. Accordingly, the access control circuit 310 programs the boot loader 451 in the defect-free memory region DFMR1 corresponding to the first start address ADD1.

An OS 453 stored in the second memory device 450 may be loaded in the memory cell array 320 of the first memory device 300A by the boot loader 451 programmed in the defect-free memory region DFMR1.

According to an exemplary embodiment of the present inventive concept, the first memory controller 430 may read only a start address corresponding to an addressing mode defined by the CPU 410 from the mode register 330, and load the boot loader 451 in a defect-free memory region corresponding to the start address. For example, the first memory controller 430 may determine an addressing mode, and generate a row address, a column address, or a bank address using a logical address.

According to an exemplary embodiment of the present inventive concept, the first memory controller 430 may read all start addresses of defect-free memory regions corresponding to a plurality of addressing modes from the mode register 330, and load the boot loader 451 in a defect-free memory region corresponding to a start address selected from among the read start addresses.

The second memory device 450 may be a non-volatile memory device which can store the boot loader 451 and the OS 453. The non-volatile memory device may be embodied in an MMC, an e-MMC, or a UFS.

Figure 10:
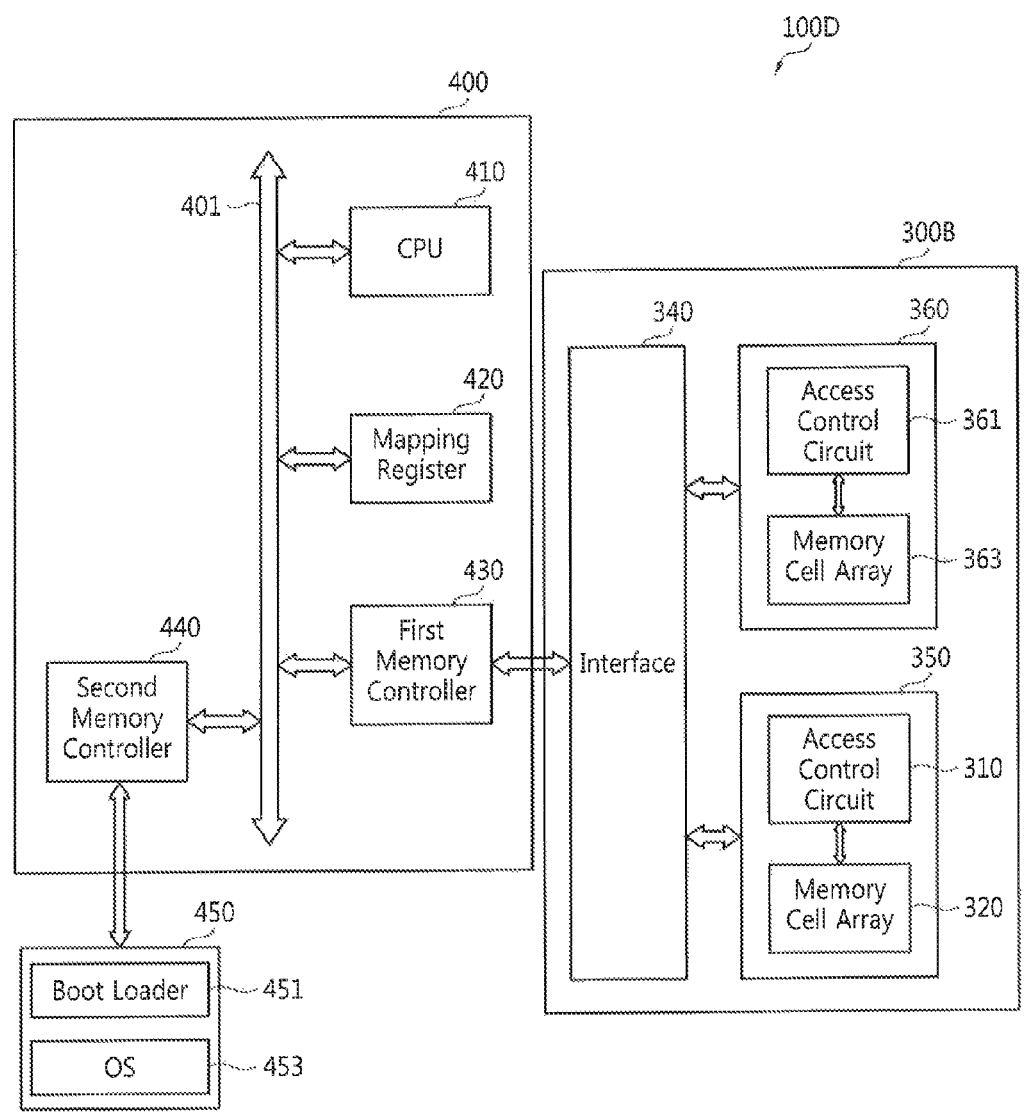
FIG. 10 is a memory system which includes a memory device including a start address of a defect-free memory region by addressing mode, according to an exemplary embodiment of the present inventive concept.

FIG. 10 is a memory system which includes a memory device including a start address of a defect-free memory region by addressing mode, according to an exemplary embodiment of the present inventive concept.

As described above, a memory device 300B may store a start address (or a table including the start address) of at least one defect-free memory region by addressing mode and a size of the defect-free memory region. A start address or a table stored in the memory device 300B may be transferred to a host 400 by a request of the host 400.

A memory system 100D may be embodied in a PC or the above-mentioned portable electronic device. The host 400 may control an operation of the first memory device 300B and a second memory device 450. The host 400 may be embodied in an integrated circuit, a SoC, an AP, or a mobile AP.

A structure and an operation of the host 400 shown in FIG. 10 are substantially the same as a structure and an operation of the host 400 shown in FIG. 9, and a structure and an operation of the first memory device 300B shown in FIG. 10 is substantially the same as a structure and an operation of the memory device 300B shown in FIG. 7.

The first memory controller 430 may control or manage an instruction and/or data to be transferred to the first memory device 300B. Moreover, the first memory controller 430 may control or manage a start address(es) or a table transferred from the first memory device 300B. The first memory controller 430 may support a plurality of addressing modes.

According to an exemplary embodiment of the present inventive concept, the first memory controller 430 may read a start address (or a table including the start address) of a defect-free memory region corresponding to an addressing mode and a size of the defect-free memory region from the first memory device 300B according to a control of the CPU 410 or when booting the memory system 100D. For example, with further reference to FIGS. 2 and 4, when the CPU 410 uses the BRC addressing mode, and the CPU 410 programs a specific program in a defect-free memory region DFMR4 having a second size SIZE2, the first memory controller 430 may read a fourth start address ADD4 from the first table TABLE1 stored in the memory cell array 363 of the second chip 360 of the first memory device 300B according to a control of the CPU 410.

The first memory controller 430 may store the fourth start address ADD4 in the mapping register 420. In this case, the first memory controller 430 may map a system address output from the CPU 410 onto the fourth start address ADD4.

The second memory controller 440 may read the boot loader 451 from the second memory device 450 according to a control of the CPU 410, and write the boot loader 451 in the defect-free memory region DFMR4 defined by the fourth start address ADD4 using the first memory controller 430. In other words, the first memory controller 430 transfers the boot loader 451 read by the second memory controller 440 and a write instruction including the fourth start address ADD4 to store the boot loader 451 to the access control circuit 310 of the first chip 350 of the first memory device 300B. Accordingly, the access control circuit 310 of the first chip 350 programs the boot loader 451 in the defect-free memory region DFMR4 corresponding to the fourth start address ADD4.

The OS 453 stored in the second memory device 450 may be loaded into the memory cell array 320 of the first chip 350 of the first memory device 300B by the boot loader 451 programmed in the defect-free memory region DFMR4.

Referring to FIGS. 9 and 10, when a size of a program (for example, the boot loader 451) to be loaded into the first memory device 300A or 300B by the host 400 is larger than the first size SIZE1 and equal to or smaller than the second size SIZE2, the host 400 may read a second start address ADD2 or a fourth start address ADD4 from the mode register 330 or the memory cell array 363 of the second chip 360 according to an addressing mode. According to an exemplary embodiment of the present inventive concept, the host 400 may read the first table TABLE1 from the mode register 330 or the memory cell array 363 of the second chip 360.

Figure 11:
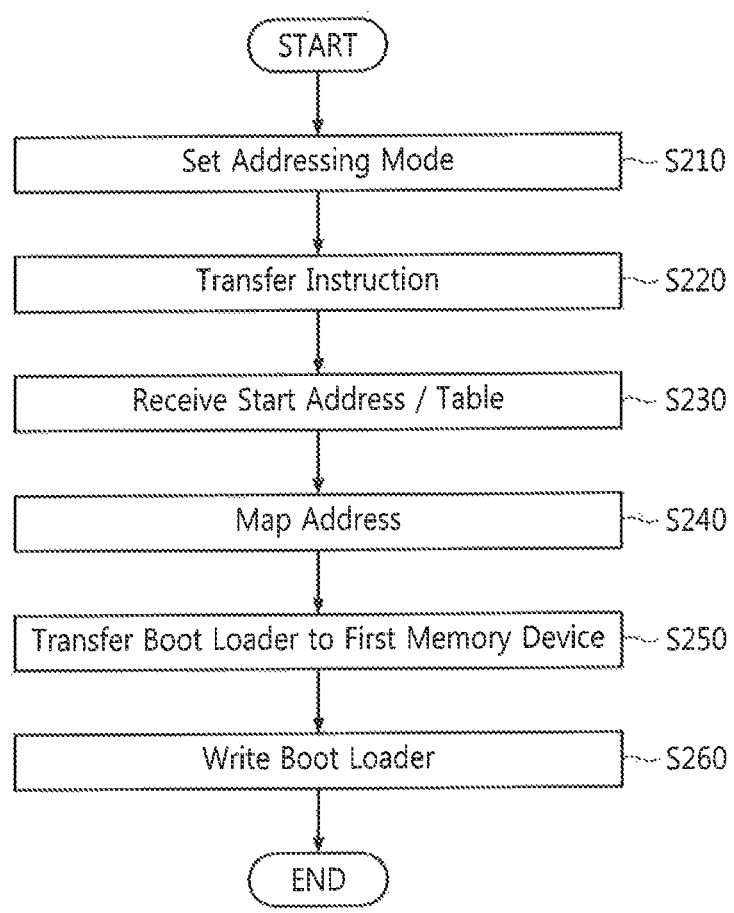
FIG. 11 is a flowchart for describing a method for operating the memory system shown in FIG. 9 or 10, according to an exemplary embodiment of the present inventive concept.

FIG. 11 is a flowchart for describing a method for operating the memory system shown in FIG. 9 or 10, according to an exemplary embodiment of the present inventive concept. Referring to FIGS. 9 to 11, an operation of the memory system 100C or 100D will be described as follows. The CPU 410 may set an addressing mode to be used by the CPU 410 in the first memory controller 430 (S210).

The first memory controller 430 transfers an instruction for reading a start address corresponding to the set addressing mode to the access control circuit 310 of the first memory device 300A or the access control circuit 361 of the second chip 360 of the first memory device 300B (S220).

According to an exemplary embodiment of the present inventive concept, the access control circuit 310 reads a start address stored in the mode register 330 or a table including the start address, and transfers the read start address or the read table to the first memory controller 430 (S230). According to an exemplary embodiment of the present inventive concept, the access control circuit 361 of the second chip 360 reads a start address stored in the memory cell array 363 or a table including the start address, and transfers the read start address or the read table to the first memory controller 430 (S230).

The first memory controller 430 stores a start address output from the first memory device 300A or 300B or a table including the start address in the mapping register 420. As described above, the mapping register 420 may be separated from the first memory controller 430, and may be embodied in a part of the first memory controller 430.

The first memory controller 430 may map a system address output from the CPU 410 onto a device address corresponding to a start address stored in the mapping register 420 (S240). The second memory controller 440 reads the boot loader 451 stored in the second memory device 450, and transfers the boot loader 451 to the first memory controller 430. The first memory controller 430 transfers a write instruction including the start address and the boot loader 451 to the first memory device 300A or 300B (S250).

The access control circuit 310 of the first memory device 300A or 300B writes the boot loader 451 in a defect-free memory region corresponding to the start address based on the write instruction (S260).

According to an exemplary embodiment of the present inventive concept, a memory device which can store a start address of at least one defect-free memory region by addressing mode may transfer the start address to a host according to a request of the host. The host may safely write a code used for a booting in a defect-free memory region corresponding to the start address using the start address corresponding to an addressing mode to be used by the host.

In a system which includes the host and the memory device according to an exemplary embodiment of the present inventive concept, when the system is powered-on, the host does not have to test all of a plurality of cells included in the memory device. Accordingly, the system may reduce booting time, and reduce power consumption in a test.

While the present inventive concept have been shown and described with reference to exemplary embodiments thereof, it will be appreciated by those skilled in the art that changes may be made in these embodiments without departing from the spirit and scope of the present inventive concept as defined in the appended claims.

What is claimed is:

1. A method for manufacturing a memory device, comprising:
   detecting, with a tester, whether memory cells included in a memory device are defective; and
   programming, with the tester, start addresses of defect-free memory regions for addressing modes in the memory device based on a result of the detection,
   wherein the start addresses are different from each other according to a size of a corresponding one of the defect-free memory regions.

2. The method of claim 1, wherein, when the memory device is a dynamic random-access memory (DRAM) including banks, each of the banks includes memory cells, and each of the defect-free memory regions is included in at least one of the banks.

3. The method of claim 1, wherein the start addresses are stored in a mode register.

4. The method of claim 1, wherein the start addresses are stored using fuses.

5. The method of claim 1, wherein when the memory device includes a first memory and a second memory, the first memory includes the defect-free memory regions and the second memory stores the start addresses.

6. The method of claim 5, wherein the first memory is a dual data rate (DDR) memory, and the second memory is a flash memory, a dynamic random-access memory (DRAM) including the flash memory, a phase-change random-access memory (PRAM), a magnetoresistive random-access memory (MRAM), a resistive random-access memory (RRAM), an embedded multimedia card (eMMC), a solid state drive (SSD), a universal serial bus (USB) flash drive, or a universal flash storage (UFS).

7. A method for operating a memory device, comprising:
   receiving an instruction from a host; and
   transferring at least one of start addresses of defect-free memory regions for addressing modes to the host in response to the instruction,
   wherein the start addresses of defect-free memory regions are programmed in the memory device in a mass-production phase, wherein the start addresses are different from each other according to a size of a corresponding one of the defect-free memory regions.

8. The method of claim 7, wherein the memory device is a dual data rate (DDR) memory, and the start addresses are stored in a mode register.

9. The method of claim 7, wherein the memory device includes:
- a dynamic random-access memory (DRAM) which includes the defect-free memory regions;
- a non-volatile memory which stores the start addresses; and
- a DRAM interface which reads at least one of the start addresses stored in the non-volatile memory in response to the instruction, and transfers the at least one read start address to the host.

10. A method for operating a memory system which includes a host, a first memory device, and a second memory device, comprising:
- reading, by the host, a first start address of a plurality of start addresses from the first memory device, wherein the plurality of start addresses correspond to defect-free memory regions for addressing modes;
- reading, by the host, a boot loader from the second memory device; and
- writing, by the host, the boot loader in a defect-free memory region corresponding to the first start address,
- wherein the addressing modes include a row-bank-column addressing mode and a bank-row-column addressing mode.

11. The method of claim 10, wherein the first memory device is a dual data rate (DDR) memory, and the start addresses are stored in a mode register.

12. The method of claim 10, wherein the first memory device includes:
- a dynamic random-access memory (DRAM) which includes the defect-free memory region;
- a non-volatile memory which stores the start addresses; and
- a DRAM interface which reads the first start address stored in the non-volatile memory in response to an instruction output from the host, and transfers the first start address to the host.

13. The method of claim 10, wherein the start addresses are different from each other according to a size of a corresponding one of the defect-free memory regions.

14. The method of claim 10, wherein the host includes:
- a central processing unit (CPU);
- a first memory controller which reads the first start addresses according to a control of the CPU; and
- a second memory controller which reads the boot loader according to a control of the CPU,
- wherein the first memory controller writes the boot loader in the defect-free memory region corresponding to the first start address.

15. The method of claim 10, wherein the host includes:
- a central processing unit (CPU);
- a first memory controller which reads the first start addresses when the system is booted; and
- a second memory controller which reads the boot loader according to a control of the CPU,
- wherein the first memory controller writes the boot loader in the defect-free memory region corresponding to the first start address.

16. The method of claim 7, wherein each start address is determined by a row value, a bank value, and a column value.

* * * * *